United States Patent [19]

Takeda

[11] Patent Number: 4,641,053

[45] Date of Patent: Feb. 3, 1987

[54] ULTRASONIC LIQUID ATOMIZER WITH AN IMPROVED SOFT START CIRCUIT

[75] Inventor: Masaaki Takeda, Osaka, Japan

[73] Assignee: Matsushita Seiko Co., Ltd., Japan

[21] Appl. No.: 640,644

[22] Filed: Aug. 14, 1984

[51] Int. Cl.⁴ ............................................ H01L 41/08
[52] U.S. Cl. .................................. 310/317; 310/316; 239/102.2
[58] Field of Search .................................. 239/4, 102; 261/DIG. 48; 310/317, 316, 318, 319; 318/116

[56] References Cited

U.S. PATENT DOCUMENTS 4,319,155  3/1982  Nakai et al. ..................... 310/316 X
4,520,289  5/1985  Sato et al. ....................... 310/317 X

FOREIGN PATENT DOCUMENTS 145031  11/1979  Japan ................................. 239/102

*Primary Examiner*—Mark O. Budd
*Attorney, Agent, or Firm*—Lowe, Price, LeBlanc, Becker & Shur

[57] ABSTRACT

In an ultrasonic liquid atomizer, an oscillator has a transistor and a resonant circuit a part of which is formed by a piezoelectric vibrator mounted in an energy transfer relationship with liquid in a chamber. The transistor and the resonant circuit receive a full-wave rectified supply voltage to generate ultrasonic energy in the vibrator in the presence of a bias voltage. A soft start circuit has a time constant circuit responsive to the bias voltage and a transistor responsive to an output of the time constant circuit which provides switching action in phase with the full-wave rectified supply voltage so that ultrasonic energy is generated in the form of a series of bursts having durations gradually increasing as a function of time during an initial brief interval from application of the bias voltage to the oscillator. A bias stabilizer has a second time constant circuit responsive to the bias voltage and a transistor connected to the output of the second time constant circuit to establish a low impedance path across the base and emitter of the transistor of soft start circuit after termination of the initial brief interval.

18 Claims, 3 Drawing Figures

ULTRASONIC LIQUID ATOMIZER WITH AN IMPROVED SOFT START CIRCUIT

BACKGROUND OF THE INVENTION

The present invention relates to an ultrasonic liquid atomizing apparatus useful for humidifying dried spaces and atomizing medicated liquid.

Conventional ultrasonic liquid atomizers include a free-running Colpitts oscillator that generates high frequency energy in the range between 800 kHz and 2000 kHz and drives a piezoelectric vibrator mounted in energy transfer relation with liquid contained in a chamber. Full-wave rectified, nonfiltered sinusoidal source voltage is derived from a mains supply and a bias voltage is derived from the full-wave source voltage. The oscillator includes a transistor which is powered by the full-wave source voltge and biased by the full-wave bias voltage. The vibrator presents an energy radiating surface which is parallel with the surface of the liquid to maximize the energy transfer efficiency. A liquid sensing switch is provided in the liquid to complete a circuit for coupling the bias voltage to the oscillator when the chamber is filled with liquid, but opens the circuit to prevent the oscillator from being overloaded in the event that the liquid is depleted.

One disadvantage of the prior art apparatus resides in that fact that acoustic energy, initially generated in response to application of a mains supply to the apparatus or in response to reapplication of the bias voltage, is totally reflected from the liquid surface and impinges on the vibrator with a high level of energy. The energy reflected back to the vibrator induces a current in the vibrator. The induced current adds to the current generated by the oscillator with the result that the combined current may exceed the ratings of the vibrator, a transistor of the oscillator and other components of the oscillator.

Previous attempts to eliminate this problem involve starting the oscillator with reduced power and gradually increasing the power until continuous oscillation is attained. One approach, which is considered most relevant to the present invention, employs a zero crossing detector that detects when the apparatus is ready for operation and detects a zero crossover point of a full-wave source voltage to drive a thyristor into conduction. Oscillation starts in response to the thyristor being rendered conductive at the zero-volt point of the full-wave source voltage and gradually increases in amplitude to attain a maximum level within the period of a halfwave of the source voltage. The prior art soft start circuit of this type has a memory and logic circuit to initiate conduction of the thyristor. The use of a zero crossing detector, thyristor and memory results in a costly and complex apparatus.

SUMMARY OF THE INVENTION

An object of the present invention is to provide a liquid atomizing apparatus having a simple and inexpensive soft start circuit.

Another object of the present invention is to provide a liquid atomizing apparatus having a soft start circuit and a bias voltage stabilizer which prevents the soft start circuit from responding to unwanted voltage fluctuations generated in the oscillator.

In accordance with the invention an apparatus used with an ultrasonic liquid atomizer having a liquid chamber for holding liquid and a piezoelectric vibrator for generating pressure variations in the liquid in response to ultrasonic energy comprises an oscillator having a power supply terminal and a resonant circuit including a piezoelectric vibrator. A power supply circuit supplies gradually increasing and decreasing voltage variations to the power supply terminal. The oscillator is sequentially prevented from conducting and enabled for conduction only during a brief period of initial operation. During the brief initial period the oscillator conducting intervals are progressively increased.

According to a feature of the present invention, a power supply circuit derives from a mains supply a full-wave rectified supply voltage and a bias voltage. An oscillator has a first transistor biased by the bias voltage and a resonant circuit, a part of which is formed by a piezoelectric vibrator. The first transistor and the resonant circuit are connected to receive the full-wave rectified supply voltage to generate ultrasonic energy in the piezoelectric vibrator in the presence of the bias voltage. The soft start circuit comprises a time constant circuit responsive to a bias voltage and a second transistor which is biased by an output from the time constant circuit. The second transistor provides switching action in phase with the full-wave rectified supply voltage so that ultrasonic energy is generated in the form of a series of bursts with durations gradually increasing as a function of time during an initial brief interval from the initial generation time of the bias voltage.

According to a further feature of the invention, a bias stabilizer having a second time constant circuit is connected to the power supply circuit and a third transistor is connected to be responsive to the output of the second time constant circuit. The time constant value of the second time constant circuit is greater than the time constant value of the first time constant circuit. The third transistor establishes a low impedance path from a junction between the first time constant circuit and the second transistor after the termination of the initial brief interval.

BRIEF DESCRIPTION OF THE DRAWINGS

The present invention will be described in further detail with reference to the accompanying drawings, in which.

DETAILED DESCRIPTION

Figure 1:
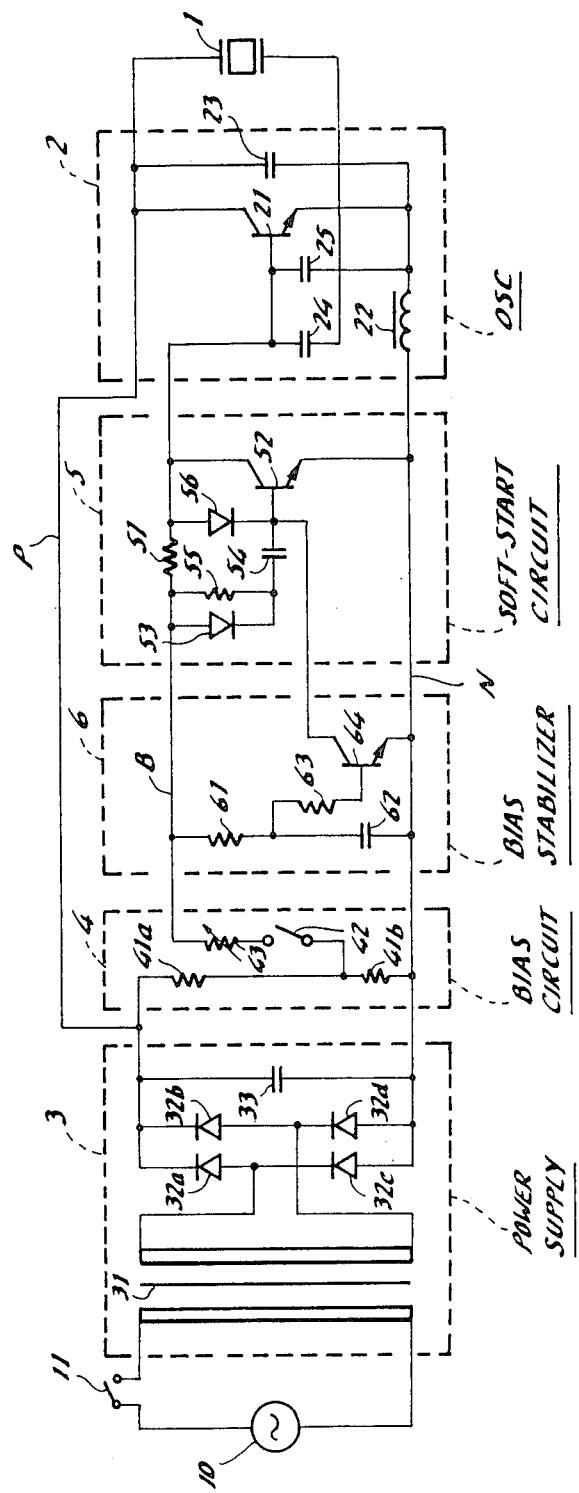
FIG. 1 is a diagram of a vibrator oscillating circuit according to the present invention.

Referring now to FIG. 1, a power supply 3 includes a step-down transformer 31 connected in use to a mains supply 10 through power switch 11 to provide an AC voltage of 40 to 60 volts to a full-wave rectifier formed by bridge diodes 32a, 32b, 32c and 32d. Full-wave rectified, nonfiltered sinusoidal halfwaves are developed across positive and negative power lines P and N between which is connected a capacitor 33 to reduce the impedance of the negative line and thereby suppress line noise and radiation noise.

A bias circuit 4 includes a series circuit of resistors 41a and 41b which is connected across power lines P and N to divide the full-wave voltage to generate a sinusoidal bias voltage which is coupled through a liquid-sensing, float-contact switch 42 and a variable resistor 43 to a bias line B. Liquid-sensing switch 42 is located in the liquid chamber of an atomizer, not shown, and is arranged so contacts thereof close and open when the liquid chamber is respectively filled with liquid and partially filled, as when the atomizer is tilted, or when liquid has been exhausted from the chamber.

The bias voltage is fed through a soft-start circuit 5 to a Colpitts oscillator circuit 2 which drives a piezoelectric transducer or vibrator 1. Soft-start circuit 5 comprises a voltage dropping resistor 51 interposed in the bias line B, a switching transistor 52 having a collector connected to the low voltage terminal of resistor 51; the switching transistor includes an emitter which is connected to a reference point or negative line N. Voltage-dropping resistor 51 serves as an attenuator for attenuating short-term voltage fluctuations of oscillator 5 to decouple the fluctuations from the bias voltage on line B.

Figure 2:
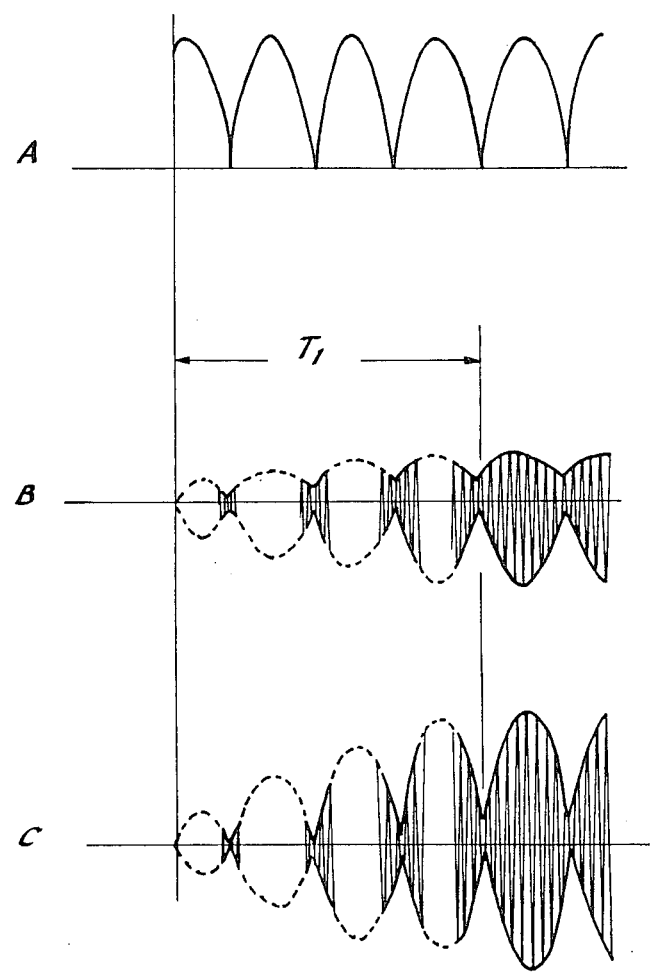
FIG. 2 includes several waveform diagrams associated with the circuit of FIG. 1.

A time constant circuit formed by diode 53 and capacitor 54 is connected from line B to the base of transistor 52. The ON-state resistance of diode 53 and the capacitance of capacitor 54 determine a time constant value which defines a "soft" start period $T_1$ for oscillator 2. A soft start for oscillator 2 implies that the oscillator is smoothly started with gradually increasing periods of oscillation. Since capacitor 54 initially presents a low impedance to the application of a potential to bias line B, current flows through diode 53 and capacitor 54 to the base of transistor 52, causing it to conduct. Transistor 52 is then turned off when bias voltage drops to a near zero-volt point to allow the bias potential to be applied to oscillator 2, but turns on again as the bias voltage increases, cutting off the bias supply to oscillator 2. This process is repeated in step with the sinusoidal bias potential on line 2. The current through diode 53 eventually decreases as the voltage on capacitor 53 approaches an exponential asymptote. Thus, the turn-off period of transistor 52 decreases successively and the bias supply period of oscillator 2 increases successively during the soft-start period $T_1$ as shown by waveform B in FIG. 2. Soft start circuit 5 further includes a resistor 55 connected in parallel with diode 53 and a diode 56 having an anode coupled to the low voltage terminal of resistor 51 and a cathode to the base of transistor 52. Resistors 51 and 55 and diode 56 form a circuit for discharging capacitor 54 when the bias voltage is removed from bias line B.

Colpitts oscillator circuit 2 includes transistor 21 having collector and emitter electrodes coupled respectively to the positive and negative lines and a base coupled to the low voltage terminal of resistor 51 of soft-start circuit 5. A parallel resonant circuit is formed by a coil 22 connected in negative line N and a capacitor 23 connected between the positive and negative lines. The parameters of this resonant circuit are determined so that the resonant circuit presents a capacitive load to transistor 21 near the resonant frequency of piezoelectric transducer 1. Coil 22 may alternatively be connected to the collector of transistor 21. The piezoelectric transducer 1 forms a feedback circuit with a DC decoupling capacitor 24 between the collector and base of transistor 21 and acts as an inductive element of the oscillator circuit. A capacitor 25, connected between the base and emitter of transistor 21, controls the amount of oscillator feedback to determine the oscillation amplitude.

With the arrangement described above, transistor 21 turns on and off at an ultrasonic frequency when switching transistor 52 is in the OFF state. During the soft start period, oscillator 21 starts whenever the power line voltage drops to a near zero-volt point; oscillation of the oscillator is interrupted as it reaches successively increasing levels as shown by waveform C, FIG. 2. As described above, the duration of the oscillations gradually increases as a function of time, whereby the oscillator is "soft" started to overcome the derivation of surge currents which otherwise would occur. A preferred length of the soft-start period determined by the time constant of diode 53 and capacitor 54 is equal to or greater than the total period of three full-wave rectified sinusoidal halfwaves. After the soft-start period, transistor 52 remains in the OFF-state to allow oscillator 2 to sustain steady-state oscillation.

The disadvantage of the oscillator is that unwanted voltage fluctuations are generated during steady-state oscillation. Unwanted current passes through diode 56 or through diode 53 and capacitor 54 to the base of transistor 52, causing the transistor to conduct. As a result, undesirable bias potential variation occurs at the base of transistor 21.

In a preferred embodiment of the present invention, a bias stablizer 6 is provided. This stabilizer comprises a resistor 61 and a capacitor 62 connected in series between the bias line B and negative power line N. The voltage developed across capacitor 62 is coupled by a resistor 63 to the base of a transistor 64 having an collector-to-emitter path connected from the base of transistor 52 to the negative power line. Resistor 61 and capacitor 62 establish a time constant which is larger than the time constant of the soft start circuit 5 so that transistor 64 conducts after transistor 52 switches to a steady OFF state. When this occurs, transistor 64 establishes a short-circuit path across the base and emitter of switching transistor 52, whereby the spurious signal passes through the short-circuit, to bypass the base-to-emitter path of transistor 52 and maintain transistor 52 in the OFF state.

This bias stabilizer also protects from surge current which might occur as result of a fault in the circuit of piezoelectric transducer 1 when the liquid is filled or a fault in the circuit of liquid sensing switch 42 when the liquid is depleted. The surge current would otherwise cause breakdown of transistor 21. The stabilizer enables dampening of the surge current the circuit comprising diode 56 and transistor 64.

Figure 3:
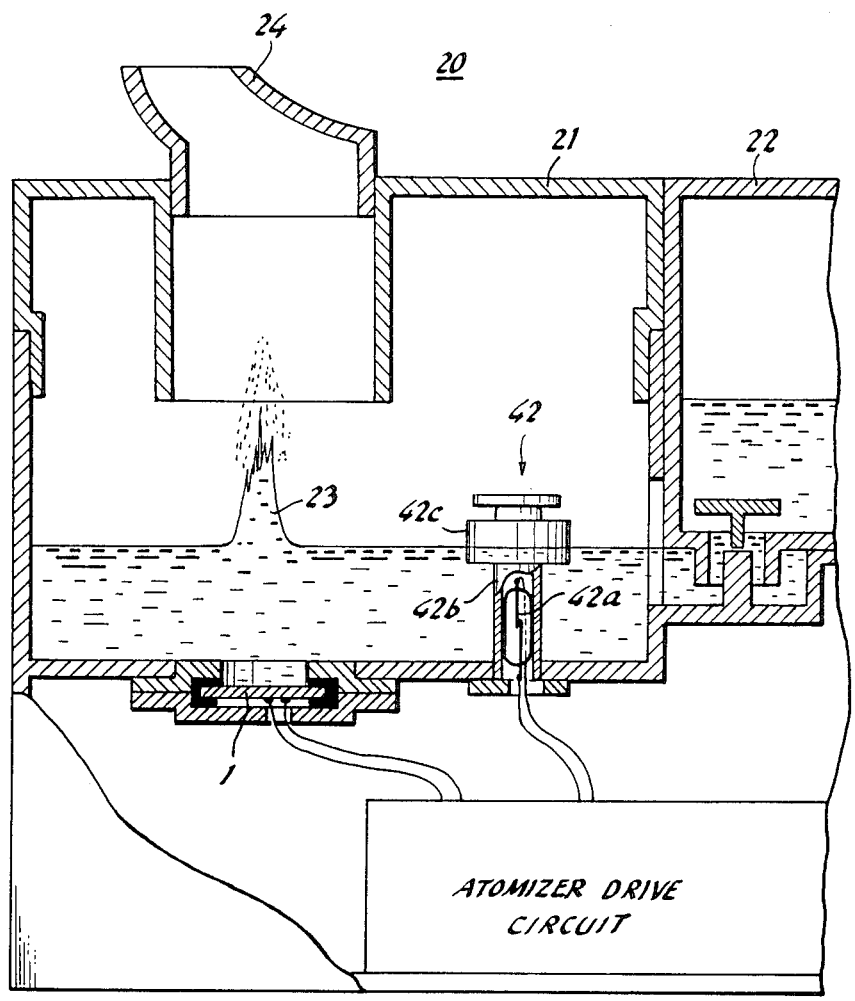
FIG. 3 is a diagram of a liquid nebulizing apparatus incorporating the circuit of FIG. 1.

An ultrasonic liquid nebulizer 20 embodying the present invention is represented in FIG. 3. The nebulizer includes reservoir 22 in communication with liquid chamber 21 to supply liquid thereto. In a typical example, chamber 21 is supplied with medicated liquid having a horizontal surface maintained at a predetermined distance above the bottom of liquid chamber 21 where piezoelectric vibrator 1 is mounted in energy transmitting relationship with the liquid. Short-duration pressure changes occur in vibrator 1 in response to ultrasonic energy generated by the oscillator 2. In response to the pressure changes, the liquid rises to form column 23 and is atomized into minute droplets ejected through a nozzle 24 to the outside.

The liquid sensing switch 42 is located in the liquid chamber 21. Switch 42 includes magnetically sensitive reed contacts 42a mounted in a sealed glass tube, in turn located in a cylinder. Coil 42c which is connected to a suitable current source, not shown, is vertically slidably mounted on cylinder 42b so that it moves with the varying surface level of the liquid. With the chamber 21 filled with liquid, coil 42c is in an upper position and switch 42a is closed to couple the bias voltage to the circuit including oscillator 2, soft start circuit 5 and bias stabilizer 6. When the liquid has been exhausted from chamber 21 and reservoir 22 or the nebulizer 20 is tilted so that the liquid surface level drops to a point near the bottom of chamber 22, coil 42c triggers switch 42a into an open condition to cut off the bias supply.

Without soft start circuit 5 piezoelectric vibrator 1 would initially create high amplitude acoustic waves which are reflected from the liquid surface to be incident on vibrator 1. Vibrator 1 responds to the reflected acoustic energy incident thereon to generate an overvoltage which damages the oscillator and associated circuits. Such overvoltages occur when power switch 11 or liquid sensing switch 42 is closed. Soft start circuit 5 softens the initially generated energy by gradually increasing it to prevent the overvoltage condition. Bias stabilizer 6 prevents the soft start circuit from responding to unwanted voltage fluctuations generated by oscillator 2 when the bias voltage supply to the transistor 21 of oscillator 2 is interrupted.

What is claimed is:

1. An apparatus for use with an ultrasonic liquid atomizer having a liquid chamber for holding liquid therein and a piezoelectric vibrator for generating pressure rises in said liquid in response to ultrasonic energy, comprising:
    power supply means connected in use to a mains supply for generating a full-wave rectified supply voltage and a bias voltage;
    an oscillator having a transistor connected to be biased by said bias voltage and a resonant circuit a part of which is formed by said piezoelectric vibrator, said transistor and said resonant circuit being connected to receive said full-wave rectified supply voltage to generate said ultrasonic energy in said piezoelectric vibrator in the presence of said bias voltage;
    a soft start circuit connected in circuit between said power supply means and said transistor for periodically interrupting the supply of said bias voltage to said transistor for variable lengths of time during an initial brief interval from the time said bias voltage is applied to said transistor so that the ultrasonic energy occurs in a series of bursts which increase gradually in duration as a function of time during said initial brief interval; and
    a bias stabilizer effective upon the termination of said initial brief period for preventing said soft start circuit from responding to an unwanted voltage generated by said oscillator.

2. An apparatus as claimed in claim 1, wherein said intitial brief period is occupied by at least three full-wave rectified halfwaves of said supply voltage.

3. An apparatus as claimed in claim 1, wherein said soft start circuit comprises:
    a resistance connected between said power supply means and said oscillator;
    a diode having a first electrode connected to a junction beween said power supply means and said resistance;
    a capacitor having one end connected to a second electrode of said diode; and
    a switching transistor having a base connected to the other end of said capacitor for switching said bias voltage developed at a juntion between said resistance and said oscillator.

4. An apparatus as claimed in claim 3, wherein said bias stabilizer comprises:
    a time constant circuit including a resistor and a capacitor connected to a junction between said power supply means and said resistance for developing a gradually increasing voltage at a junction between said resistor and capacitor; and
    a second switching transistor for providing a low impedance path to the base of the first-mentioned switching transistor when the last mentioned voltage reaches a predetermined value.

5. An apparatus as claimed in claim 1, further comprising means provided in said liquid chamber for coupling said bias voltage to said oscillator, said soft start circuit and said bias stabilizer when said liquid at least partially fills said liquid chamber and decoupling said bias voltage when said liquid is depleted.

6. An apparatus for use with an ultrasonic liquid atomizer having a liquid chamber for holding liquid therein and a piezoelectric vibrator for generating pressure rises in said liquid in response to ultrasonic frequency energy, comprising:
    power supply means connected in use to a mains supply for generating a full-wave rectified supply voltage and a bias voltage with respect to a reference point;
    an oscillator having a first transistor connected to be biased by said bias voltage and a resonant circuit a part of which is formed by said piezoelectric vibrator, said transistor and said resonant circuit being connected to receive said full-wave rectified supply voltage to generate said ultrasonic energy in said piezoelectric vibrator in the presence of said bias voltage; and
    a soft start circuit including a first time constant circuit connected to said power supply means and a second transistor biased by the output of said time constant circuit, said second transistor providing switching action in phase with said full-wave rectified supply voltage so that the ultrasonic energy is generated in the form of a series of bursts having durations gradually increasing as a function of time during an initial brief interval from application of said bias voltage to said oscillator.

7. An apparatus as claimed in claim 6, wherein the first time constant circuit has a time constant value, and further comprising a bias stabilizer including a second time constant circuit connected to said power supply means and a third transistor connected to be responsive to the output of said second time constant circuit, said third transistor establishing a low impedance path from a junction between said first time constant circuit and said second transistor after the termination of said initial brief interval, said second time constant circuit having a time constant value greater than the time constant value of said time constant circuit.

8. An apparatus as claimed in claim 7, wherein said soft start circuit comprises:
    a first resistance connected at a first end to said power supply means and at a second end to said first transistor, said first time constant circuit including a first diode and a capacitor connected in series from said first end of said first resistance to said second transistor; and
    a discharge circuit including a second diode connected from said second end of said first resistance to a junction between said first time constant circuit and said second transistor and a second resistance connected between said capacitor and said first end of said first resistance, said third transistor of said bias stablizer being connected from the junction between said capacitor and said second transistor to said reference point.

9. An apparatus as claimed in claim 6, wherein the time constant value of said first time constant circuit determines the length of said initial brief interval, said initial brief interval being equal to or greater than a period occupied by at least three full-wave rectified halfwaves of said supply voltage.

10. A combination comprising:
an ultrasonic liquid atomizer having a liquid chamber for holding liquid therein and a piezoelectric vibrator for generating pressure rises in said liquid in response to ultrasonic energy and atomizing the liquid;

voltage supply means connected in use to a mains supply and generating therefrom a full-wave rectified voltage;

an oscillator having a bias terminal for generating said ultrasonic energy supplied with said full-wave rectified voltage;

first means for periodically interrupting the supply of said full-wave rectified voltage to the bias terminal of said oscillator for variable lengths of time during an initial brief interval from application of said full-wave rectified voltage to the bias terminal of said oscillator so that the ultrasonic energy is generated in the form of a series of bursts which increase gradually in duration as a function of time during said initial brief interval; and second means effective upon the termination of said initial brief interval for preventing said first means from being affected by an unwanted voltage generated said oscillator.

11. A combination as claimed in claim 10, further comprising means located in said liquid chamber for coupling said full-wave rectified voltage to the bias terminal of said oscillator, said first and second means when said chamber is at least partially filled with the liquid and decoupling said bias voltage when said liquid is depleted.

12. A combination comprising:
an ultrasonic liquid atomizer having a liquid chamber for holding liquid therein and a piezoelectric vibrator for generating pressure rises in said liquid in response to ultrasonic energy;

a power circuit connected in use to a mains supply for generating a full-wave rectified supply voltage;

a bias circuit connected to said power circuit for generating a bias voltage;

an oscillator having a first transistor connected to be biased by said bias voltage and a resonant circuit a part of which is formed by said piezoelectric vibrator, said transistor and said resonant circuit being connected to receive said full-wave rectified supply voltage to generate said ultrasonic energy in said piezoelectric vibrator in the presence of said bias voltage; and a soft start circuit including a first time constant circuit connected to said bias circuit and a second transistor connected to be powered by said bias voltage and biased by the output of said time constant circuit, said second transistor providing switching action in phase with said fullwave rectified supply voltage so that the ultrasonic energy is generated in the form of bursts whose durations gradually increase as a function of time during an initial brief interval from application of said bias voltage to said oscillator.

13. An apparatus as claimed in claim 12, wherein the first time constant circuit has a time constant value, and further comprising a bias stabilizer including a second time constant circuit connected to said bias circuit and a third transistor connected to be responsive to an output of said second time constant circuit, said third transistor establishing a low impedance path from a junction between said first time constant circuit and said second transistor after the termination of said initial brief interval, said second time constant circuit having a time constant value greater than the time constant value of said first time constant circuit.

14. A combination as claimed in claim 13, further comprising means located in said liquid chamber for coupling said bias voltage to said oscillator, said soft start circuit and said bias stabilizer when said chamber is at least partially filled with the liquid and decoupling said bias voltage when said liquid is depleted.

15. An apparatus for use with an ultrasonic liquid atomizer having a liquid chamber for holding liquid therein and a piezoelectric vibrator for generating pressure variations in said liquid in response to ultrasonic energy, comprising:
an oscillator having a power supply terminal and a resonant circuit including said piezoelectric vibrator, a power supply circuit for supplying gradually increasing and decreasing voltage variations to said power supply terminal, and means operative only during a brief period after initial operation of said oscillator for sequentially preventing and enabling conduction of said oscillator and for progressively increasing conducting intervals of said oscillator during said brief period.

16. An apparatus as claimed in claim 15 wherein said power supply circuit is responsive to an a.c. power line and includes a full-wave rectifier for deriving the gradually increasing and decreasing voltage variations as full-wave rectified voltage variations.

17. An apparatus as claimed in claim 15 wherein the means for sequentially preventing and enabling includes a timing circuit activated in response to a switch being closed for applying progressively larger forward bias voltages to a control electrode of an active element of the oscillator.

18. An apparatus as claimed in claim 15 wherein the oscillator includes means responsive to the power supply circuit and the means for sequentially preventing and enabling conduction so that the oscillator conducts (a) only during low voltage portions of the increasing and decreasing voltage variations during the beginning of the period, (b) during all portions of the increasing and decreasing voltage variations at the end of the period and (c) there is a gradual increase in the maximum voltage of the increasing and decreasing voltage variations from the beginning to the end of the period.

* * * * *